US008102887B2

(12) United States Patent
Bhagavatula et al.

(10) Patent No.: US 8,102,887 B2
(45) Date of Patent: Jan. 24, 2012

(54) EDGE BONDED OPTICAL PACKAGES

(75) Inventors: Venkata Adiseshaiah Bhagavatula, Big Flats, NY (US); Satish Chandra Chaparala, Painted Post, NY (US); John Himmelreich, Horseheads, NY (US); Lawrence Charles Hughes, Jr., Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 12/471,681

(22) Filed: May 26, 2009

(65) Prior Publication Data
US 2010/0303110 A1 Dec. 2, 2010

(51) Int. Cl.
*H01S 3/10* (2006.01)

(52) U.S. Cl. ........................................... 372/22

(58) Field of Classification Search ............ 372/22
See application file for complete search history.

(56) References Cited

U.S. PATENT DOCUMENTS

| 5,412,502 | A | 5/1995 | Makio et al. |
| 5,418,802 | A | 5/1995 | Chwalck |
| 5,459,744 | A | 10/1995 | Hayashi |
| 5,517,525 | A | 5/1996 | Endo et al. |
| 5,570,444 | A | 10/1996 | Janssen et al. |
| 5,644,584 | A * | 7/1997 | Nam et al. ................ 372/20 |
| 5,801,876 | A | 9/1998 | Kouta |
| 5,805,630 | A | 9/1998 | Valster et al. |
| 5,836,073 | A | 11/1998 | Mizuuchi et al. |
| 5,914,972 | A * | 6/1999 | Siala et al. ................ 372/33 |
| 5,936,985 | A * | 8/1999 | Yamamoto et al. ........ 372/31 |
| 5,940,557 | A | 8/1999 | Harker |
| 5,982,788 | A | 11/1999 | Hemmati |
| 6,056,447 | A | 5/2000 | Caras |
| 6,064,512 | A | 5/2000 | Byer et al. |
| 6,093,939 | A | 7/2000 | Artigue et al. |
| 6,307,657 | B1 | 10/2001 | Ford |
| 6,317,546 | B1 | 11/2001 | Kasazumi et al. |
| 6,360,041 | B1 | 3/2002 | Nakama et al. |
| 6,381,387 | B1 | 4/2002 | Wendland, Jr. |
| 6,441,970 | B2 | 8/2002 | Kasazumi et al. |
| 6,721,479 | B2 | 4/2004 | Lasecki et al. |
| 6,724,959 | B1 | 4/2004 | Takahashi et al. |

(Continued)

FOREIGN PATENT DOCUMENTS
EP 1 239 559 A2 9/2002
(Continued)

OTHER PUBLICATIONS

Ito, K. et al. "Theoretical Study on Intra-Cavity Distributed-Bragg-Reflection Quasi-Phase-Matched Second-Harmonic Lasers" Optical Review, vol. 2, No. 5, 1995, pp. 371-376.

(Continued)

*Primary Examiner* — Patrick Stafford
(74) *Attorney, Agent, or Firm* — Joseph M. Homa

(57) ABSTRACT

Particular embodiments of the present disclosure bring an SHG crystal, or other type of wavelength conversion device, into close proximity with a laser source to eliminate the need for coupling optics, reduce the number of package components, and reduce package volume. According to one embodiment of the present disclosure, an optical package is provided comprising a laser source subassembly comprising a laser base and a wavelength conversion device subassembly comprising a converter base. The bonding interface of the laser base is bonded the complementary bonding interface of the converter base such that the laser output face can be proximity-coupled to the converter input face at an predetermined interfacial spacing x. Additional embodiments are disclosed and claimed.

22 Claims, 7 Drawing Sheets

U.S. PATENT DOCUMENTS

| | | |
|---|---|---|
| 6,785,457 B2 | 8/2004 | Mizuuchi et al. |
| 6,996,140 B2 | 2/2006 | Waarts et al. |
| 7,027,209 B2 | 4/2006 | Zanger et al. |
| 7,173,950 B2 | 2/2007 | Hand et al. |
| 7,177,340 B2 | 2/2007 | Lang et al. |
| 7,474,678 B2 | 1/2009 | Heo et al. |
| 2001/0055446 A1 | 12/2001 | Iwashita et al. |
| 2002/0024978 A1* | 2/2002 | Inagaki et al. ............ 372/20 |
| 2002/0154866 A1 | 10/2002 | Tombling et al. |
| 2002/0159489 A1 | 10/2002 | Wolak et al. |
| 2003/0035229 A1 | 2/2003 | Willis |
| 2003/0095326 A1 | 5/2003 | Dijaili et al. |
| 2003/0108304 A1 | 6/2003 | Ziari et al. |
| 2004/0057686 A1 | 3/2004 | Steinberg et al. |
| 2005/0068998 A1* | 3/2005 | Katsura et al. ............ 372/21 |
| 2005/0111079 A1 | 5/2005 | Wang et al. |
| 2006/0002436 A1 | 1/2006 | Takabayashi et al. |
| 2007/0014325 A1 | 1/2007 | Park et al. |
| 2008/0317072 A1 | 12/2008 | Essaian et al. |

FOREIGN PATENT DOCUMENTS

| | | |
|---|---|---|
| EP | 0 822 429 B1 | 6/2010 |

OTHER PUBLICATIONS

Schiehlen, E., et al; Blue-green Emitting Semiconductor Disk Lasers with Intra-Cavity Frequency Doubling: Annual Report 2001; Optoelectronics Department, University of Ulm, pp. 1-6.

Maclean, A.J., et al; High power intracacity second harmonic generation in Vertical External Cavity Surface Emitting Lasers at 1060 nm; In: Photon 06; Sep. 4-7, 2006; Manchester, UK.

Fallahi, M., et al; Novel semiconductor lasers attractive for UV-visible applications; SPIE Newsroom; pp. 1-3; 10, 1117/2; 1200901, 1473.

Akulova, Y.A. et al; Widely-Tunable Electroabsorption-Modulated Sampled Grating DBT Laser Integrated With Semiconductor Optical Amplifier; 2001 Optical Society of America.

Office Action pertaining to U.S. Appl. No. 12/471,666 dated Feb. 17, 2011.

Office Action pertaining to U.S. Appl. No. 12/471,666 dated Apr. 11, 2011.

* cited by examiner

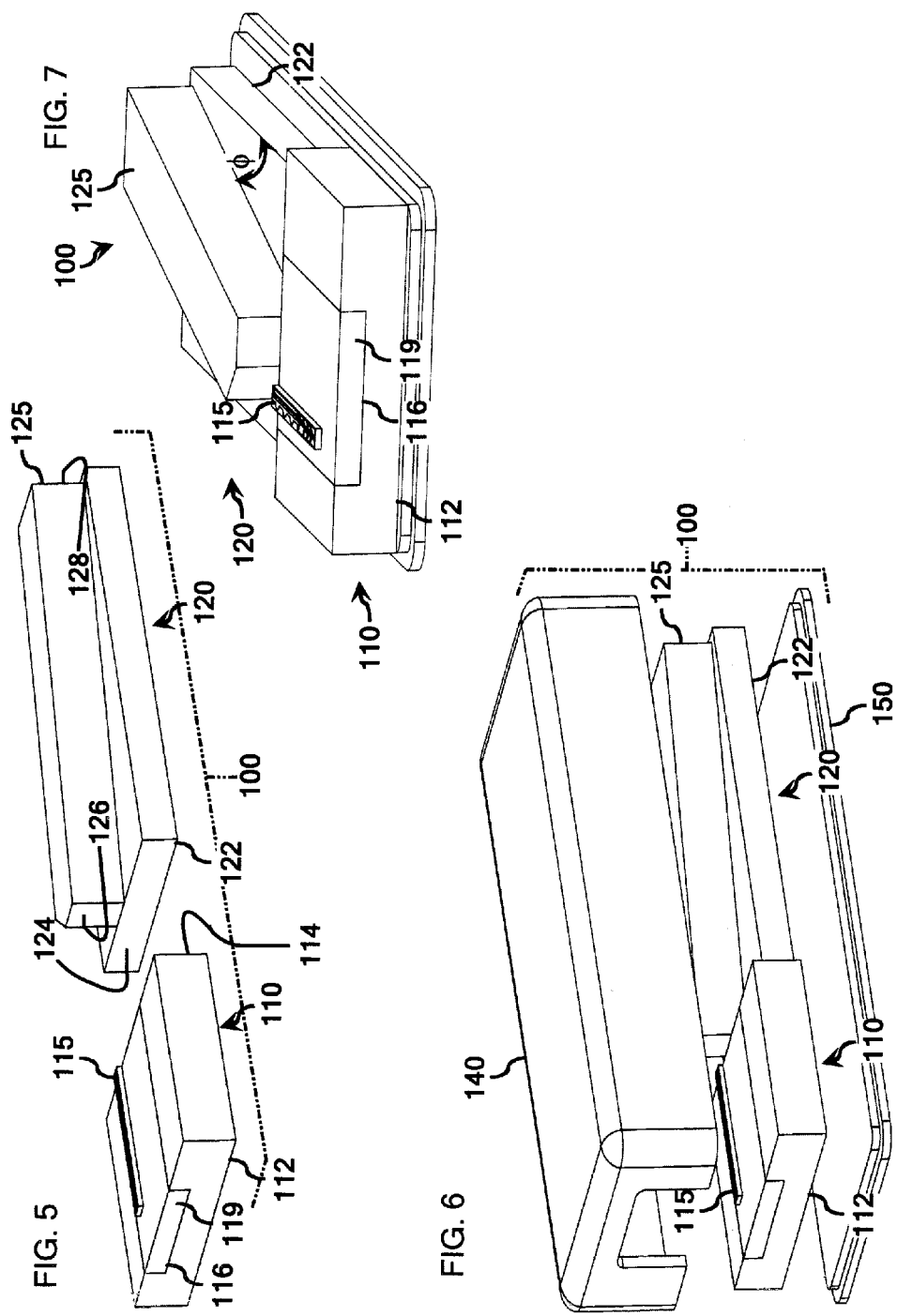

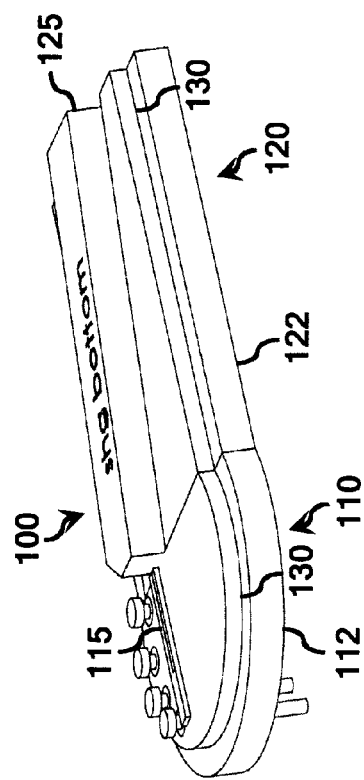
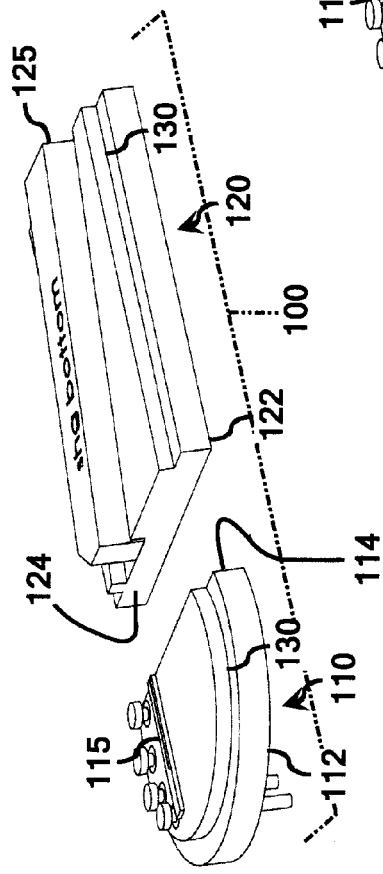
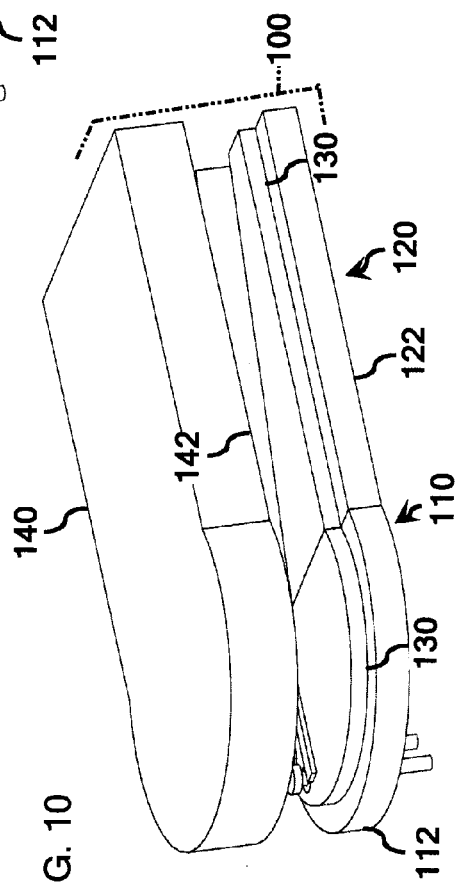

EDGE BONDED OPTICAL PACKAGES

BACKGROUND

The present disclosure relates to frequency-converted laser sources, laser projection systems and, more particularly, to optical packaging configurations for laser sources and multi-color laser projectors in applications such as cell phones, PDAs, laptop computers, etc.

BRIEF SUMMARY

The present inventors have recognized that frequency-converted laser sources and multi-color laser projectors must be compact to be feasible for many projection applications. This object is particularly challenging in multi-color projection systems requiring three independent color sources (red, green, blue). Although red and blue sources are reasonably compact, frequency-converted green laser sources present a particular challenge in this respect because they commonly utilize an IR laser source and a second harmonic generation (SHG) crystal or some other type of wavelength conversion device. Active or passive coupling optics are often utilized to ensure proper alignment of the IR pump light with the waveguide of the SHG crystal. The package may also include hardware for enhancing mechanical stability over a wide temperature range. Together, these components increase overall package volume and operational complexity.

Particular embodiments of the present disclosure bring the SHG crystal, or other type of wavelength conversion device, into close proximity with the laser source to eliminate the need for coupling optics, reduce the number of package components, and reduce package volume. According to one embodiment of the present disclosure, an optical package is provided comprising a laser source subassembly comprising a laser base and a wavelength conversion device subassembly comprising a converter base. The bonding interface of the laser base is bonded the complementary bonding interface of the converter base such that the laser output face can be proximity-coupled to the converter input face at an predetermined interfacial spacing x. Independent pre-fabrication and characterization of the respective sub-assemblies for precise facet alignment leads to reduced waste and lower cost. Additional embodiments are disclosed and contemplated. For example, it is contemplated that the concepts of the present disclosure will be applicable to any optical package comprising a source, laser or non-laser, and receiver, whether it be a wavelength conversion device or some other type of downstream optical component.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which:

FIGS. 5-7 illustrate an optical package comprising a laser source subassembly and an independent wavelength conversion device subassembly where edge bonding is facilitated via complementary bonding interfaces;

FIGS. 8-10 illustrate an optical package comprising a laser source subassembly and an independent wavelength conversion device subassembly where a common securement engages a peripheral abutment extending along the laser base and the converter base;

DETAILED DESCRIPTION

Figures 1, 2:
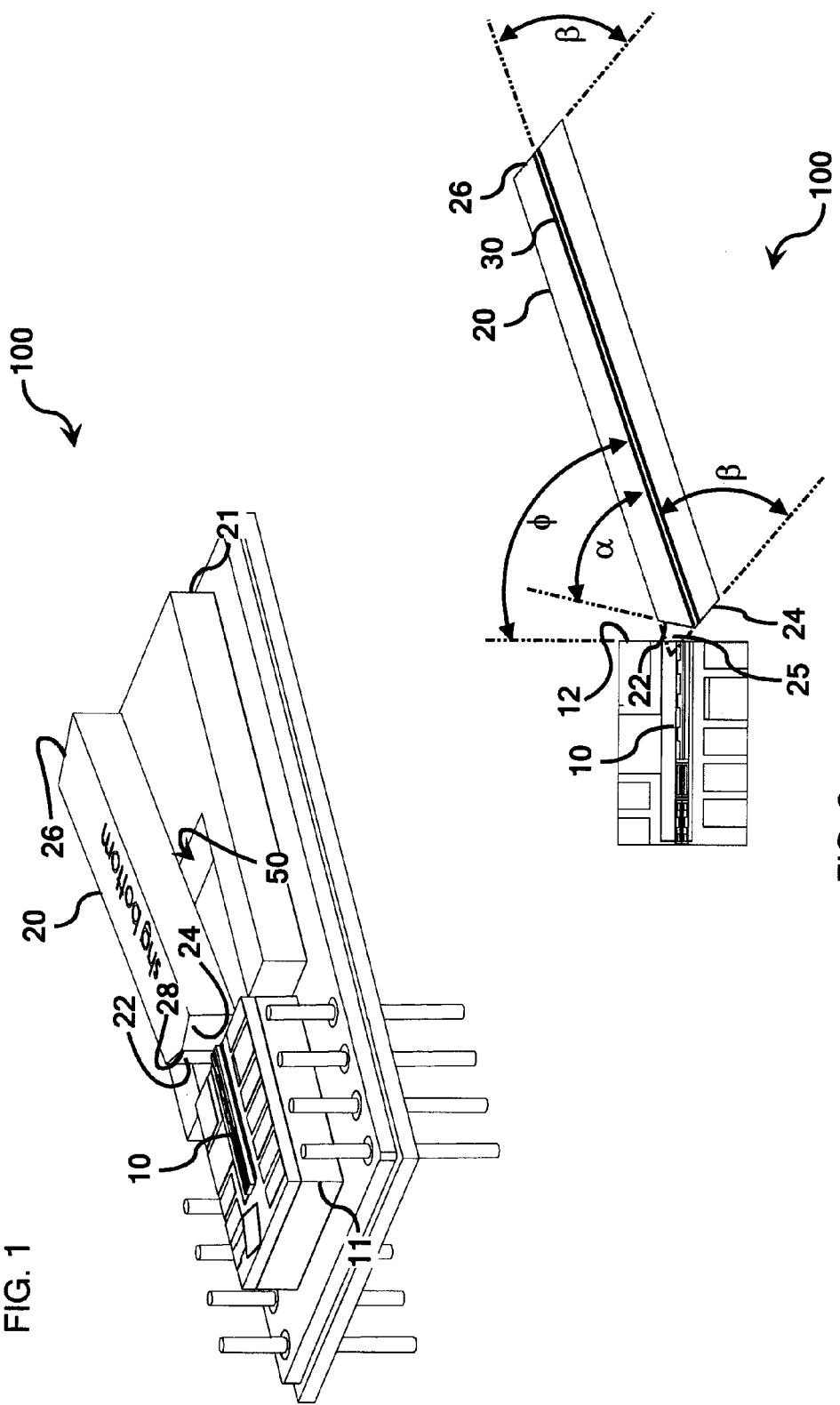
FIGS. 1 and 2 illustrate a proximity-coupled optical package according to one embodiment.

Referring initially to FIG. 1 and FIG. 2, an optical package 100 according to one embodiment of the present disclosure is illustrated. FIG. 1 illustrates an optical package 100 comprising a laser source 10 and a wavelength conversion device 20. The wavelength conversion device 20 comprises an input face formed of an $\alpha$-cut facet 22 and $\beta$-cut facet 24, an output face 26, and a waveguide 30 extending from the input face to the output face 26. The laser source 10 is positioned such that an output face 12 of the laser source 10 is proximity-coupled to the waveguide portion of the input face of the wavelength conversion device 20.

For the purposes of describing and defining the present disclosure, it is noted that a laser source can be considered to be "proximity-coupled" to a wavelength conversion device when the proximity of the output face of the laser source and the input face of the wavelength conversion device is the primary mechanism for coupling an optical signal from the laser source into the waveguide of the wavelength conversion device. Typical proximity-coupled packages will not employ collimating, focusing, or other types of coupling optics in the optical path between the laser source and the wavelength conversion device, although it is contemplated that some proximity-coupled packages may employ relatively insignificant optical elements between the laser and wavelength conversion device, such as optical films, protective elements, correction lenses, optical filters, optical diffusers, etc. In any case, for proximity-coupled packages, it is contemplated that the proximity of the laser and the wavelength conversion device will be responsible for at least 30% of the optical intensity coupled from the laser to the wavelength conversion device.

FIG. 2, where like structure is indicated with like reference numerals, illustrates the input face of the wavelength conversion device 20 in greater detail. As is noted above, the input face of the wavelength conversion device comprises an $\alpha$-cut facet 22 and $\beta$-cut facet 24. The $\alpha$-cut facet 22 of the input face is oriented at a horizontal angle $\alpha$, relative to the waveguide 30 of the wavelength conversion device 20 to permit proximity coupling of the output face 12 of the laser source 10 and the input face of the wavelength conversion device 20. The $\beta$-cut facet 24 of the input face is oriented at a horizontal angle $\beta$, relative to the waveguide 30 of the wavelength conversion device 20 and cooperates with the horizontal tilt angle $\phi$ to reduce back reflections from the input face of the wavelength conversion device 20 into the laser source 10, which are commonly caused by light being reflected from the input face of a waveguide back into the acceptance cone of the output face of a laser source.

To facilitate the aforementioned proximity coupling, the angle α and the angle β should be selected to satisfy the following relation:

$$\alpha < 180° - \beta < \phi.$$

Figures 3A, 3B:
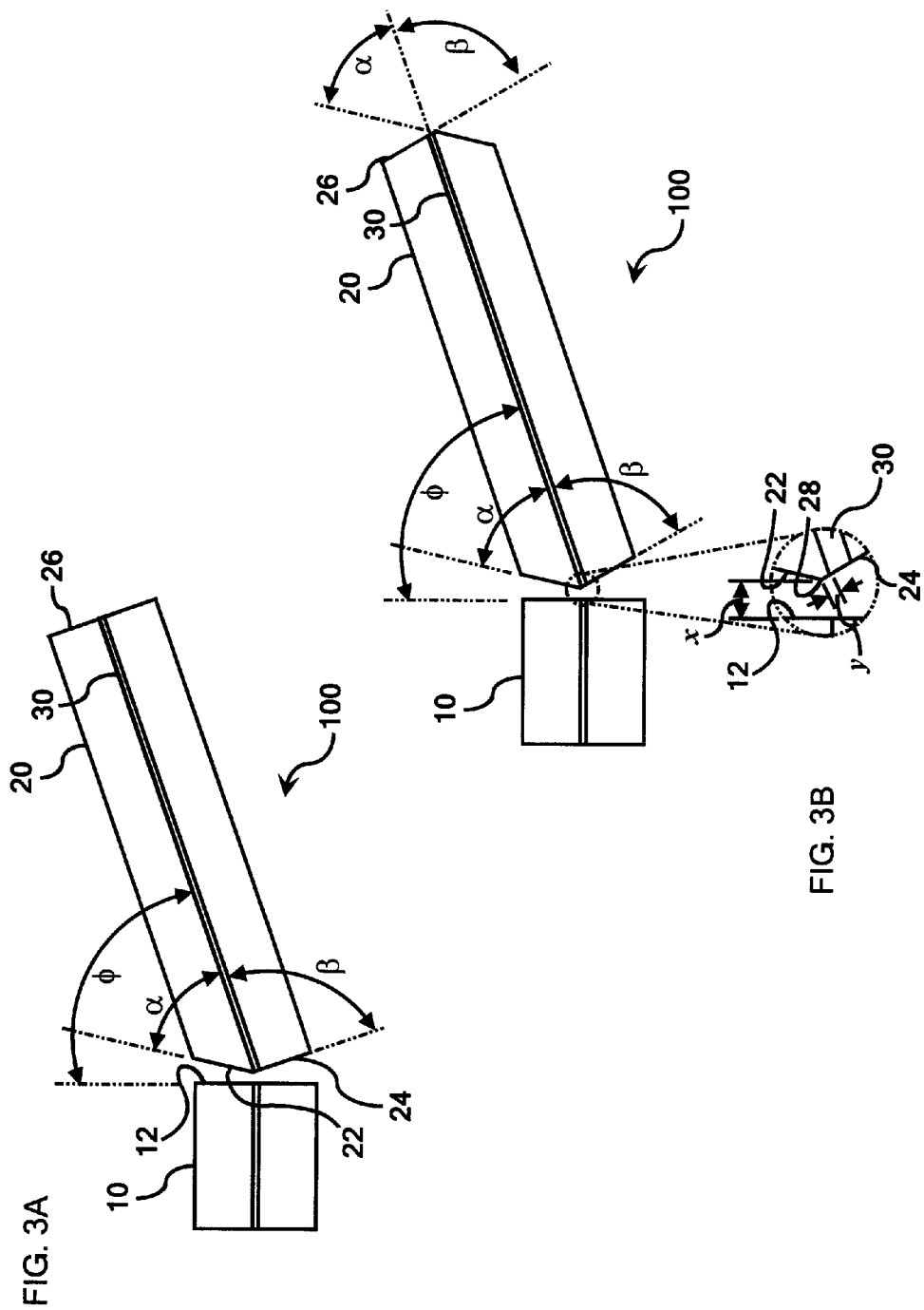
FIGS. 3A and 3B are schematic plan views of further alternatives for providing a wavelength conversion device in an optical package similar to that illustrated in FIGS. 1 and 2.

As is illustrated in FIGS. 2, 3A and 3B, where like structure is indicated with like reference numerals, and where the waveguide 30 is oriented at a horizontal tilt angle φ relative to the output face 12 of the laser source 10, to further enhance proximity coupling, the angle α of the α-cut facet 22 is typically established at a value that is less than the horizontal tilt angle φ, as measured along a common direction from the waveguide 30. Alternatively, it may merely be sufficient to ensure that the α-cut facet 22, the β-cut facet 24, or both are oriented at acute angles relative to the waveguide 30 of the wavelength conversion device 20, which, for the purposes of describing and defining the present disclosure, is an angle less than 90°. For example, and not by way of limitation, the horizontal tilt angle φ may fall between approximately 75° and approximately 85°, the angle α of the α-cut facet 22 may be about 10° to about 15° less than the horizontal tilt angle φ, and the angle β of the β-cut facet 24 may be about 80°.

Regardless of the particular angles selected for the angle α and the angle β, the α-cut facet 22 and the β-cut facet 24 will form an apex 28 on the input face. As is illustrated in FIG. 3B, the apex 28 is spaced from the waveguide portion of the input face, typically by a waveguide spacing y of less than approximately 20 μm. Further, the apex 28 is spaced from the output face 12 of the laser source 10 by an interfacial spacing x, which can be on the order of less than approximately 5 μm. Proximity coupling is facilitated in the illustrated embodiments because the relative sign and magnitude of the angles α and β yield a vacated body portion 25, which would otherwise be present in a wavelength conversion device not including the α-cut facet 22. In a proximity-coupled package, the vacated body portion 25, the bounds of which are illustrated with dashed lines in FIG. 2, breaches the output face 12 of the laser source 10 and illustrates the degree to which the α-cut facet 22 enhances proximity coupling. Stated differently, the α-cut facet 22 removes portions of the wavelength conversion device 20 that would otherwise present a physical obstruction to close proximity coupling. This removed portion is illustrated in FIG. 2 as the vacated body portion 25.

The laser source 10 is preferably proximity-coupled to the waveguide 30 portion of the wavelength conversion device 20 without the use of intervening optical components. For the purposes of describing and defining the present disclosure, it is noted that "intervening optical components" are those whose optical properties are not necessary to support the functionality of the laser source or the wavelength conversion device. For example, intervening optical components would include a collimating or focusing lens positioned in the optical path between the laser source and the wavelength conversion device but would not include anti-reflective or reflective coatings formed on the output face of the laser or on the input face of the wavelength conversion device.

In the embodiments of FIGS. 2 and 3A, the output face 26 of the wavelength conversion device is oriented to match the angle β of the β-cut facet 24. Alternatively, as is illustrated in FIG. 3B, it is contemplated that the output face 26 of the wavelength conversion device 20 may comprise an additional pair of facets that mirror the α-cut facet and the β-cut facet of the input face of the wavelength conversion device.

FIGS. 4A-4D are schematic elevation views illustrating the manner in which a wavelength conversion device 20 may be tilted vertically in an optical package 100 to complement the corresponding tilt of the output face 12 of the laser source 10. More specifically, referring collectively to FIGS. 4A-4D, in some applications, the output face 12 of the laser source 10 will be oriented at a vertical angle δ relative to the optical axis 15 of the laser source 10. This angle is typically on the order of a few degrees but has been exaggerated in FIGS. 4A-4D for illustrative purposes. Similarly, the input face of the wavelength conversion device 20 will be oriented at a vertical angle θ relative to the waveguide of the wavelength conversion device. The vertical angle θ typically exceeds 90° but can take a variety of values depending on the particular wavelength conversion device 20 selected for the optical package, including the orthogonal angle illustrated in FIG. 4B. The vertical angle θ of the input face and the vertical tilt angle γ of the wavelength conversion device 20, which is taken relative to the optical axis 15, are selected to at least partially compensate for optical misalignment introduced by the laser output face angle δ.

Figure 4B:
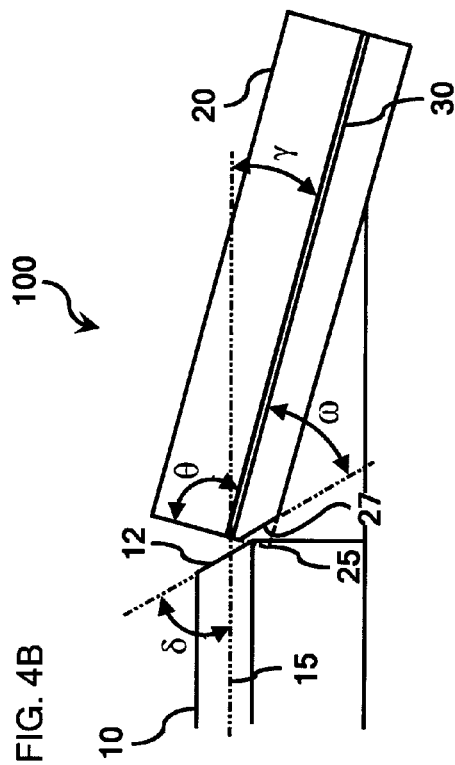
FIGS. 4A-4D are schematic elevation views illustrating the manner in which a wavelength conversion device may be tilted vertically in an optical package similar to that illustrated in FIGS. 1 and 2.
Figure 4A:
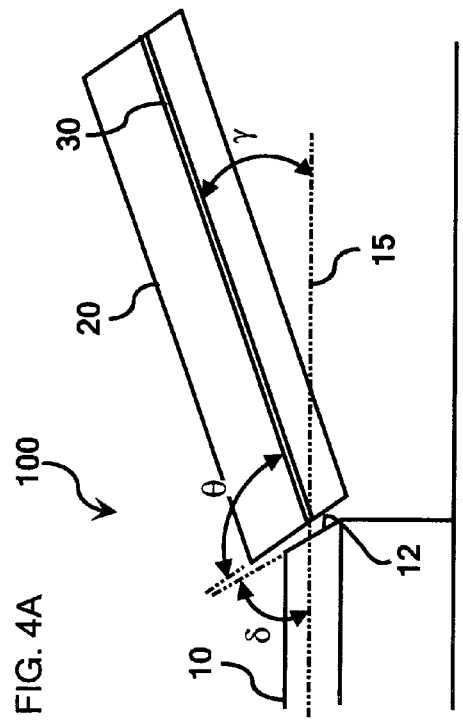
Figure 4D:
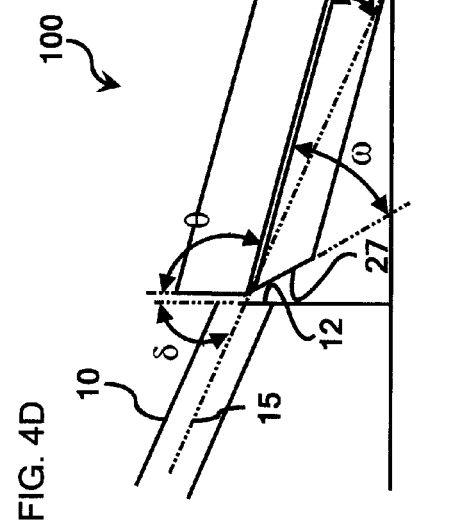
Figure 4C:
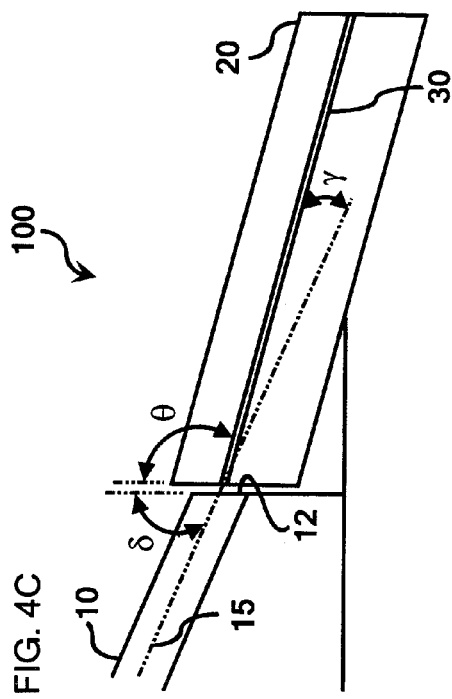

Referring to FIGS. 4B and 4D, to further facilitate proximity coupling in some embodiments, it may be preferable to provide the input face of the wavelength conversion device 20 with an ω-cut facet 29 oriented at a vertical angle ω, relative to the waveguide 30. The ω-cut facet 29 functions in a manner similar to the α-cut facet 22 of FIGS. 1-3 in that it removes portions of the wavelength conversion device 20 that would otherwise present a physical obstruction to close proximity coupling. See, for example, the vacated body portion 25 illustrated in FIG. 4B. Based on the tilts in the output face 12 of the laser source 10 and the corresponding angled facets polished into the input face of the wavelength conversion device 20, the substrates of the laser source 10 and the wavelength conversion device 20 can be tapered as shown in FIGS. 4B and 4D. Such tapering of the substrates facilitates easier facet alignment during subassembly fabrication. With these suitably predetermined tapered angles, the proximity gaps can be minimized without damaging the output face 12 of the laser source 1 or the input face of the wavelength conversion device 20. In addition, the aforementioned tapering minimizes angular misalignment losses and provides better coupling efficiency.

To help preserve optimum optical coupling in proximity-coupled optical packages where the wavelength conversion device 20 and the laser source 10 are supported by independent stacks, the respective coefficients of thermal expansion of the independent stacks can be matched to account for thermal expansion of the respective stacks, which could otherwise cause losses in coupling efficiency between the laser source 10 and the wavelength conversion device 20 as the optical package is subjected to temperature excursions during normal operation. In many cases, it will not be difficult to athermalize the proximity-coupled optical packages illustrated herein because the absence of coupling optics permit reduced stack heights, making it easier to match the respective coefficients of thermal expansion of the independent stacks.

For example, referring to FIG. 1, where the laser source 10 is supported by a laser stack 11 and the wavelength conversion device 20 is supported by a converter stack 21, the optical package 100 can be athermalized by ensuring that the respective coefficients of thermal expansion of the two independent stacks 11, 21 are matched. For example, in one embodiment the coefficients of thermal expansion of the two independent stacks 11, 21 are matched to within approximately 0.01 μm over the operating temperature range of the optical package 100. For example, the laser stack 11 may comprise aluminum nitride, Au metallization pads and molybdenum and the converter stack 21 may comprise silicon. For the purposes of defining and describing the present disclosure, it is noted that a "stack" may comprise any number of layers. Additionally, it is contemplated that the degree to which the coefficients of thermal expansion are matched may be increased or decreased depending on the desired degree of coupling efficiency.

FIG. 1 also illustrates the use of an underlying thermal void 50 to mitigate thermal gradients that develop within the wavelength conversion device 20 during operation of the optical package 100. Because the laser source 10 is proximity-coupled to the wavelength conversion device 20, significant thermal gradients can be induced along the length of the wavelength conversion device 20 due to a difference in temperature between the input face and the output face 26 of the wavelength conversion device 20, particularly when the optical package 100 is passively cooled, for example by natural convection. These thermal gradients can decrease the efficiency of the wavelength conversion device 20 by shifting the phase matching wavelength beyond the spectral width of the fundamental laser light. As is illustrated in FIG. 1, the underlying thermal void 50 can be provided in the vicinity of the input face of the wavelength conversion device 20 to help thermally isolate the input end of the wavelength conversion device 20 and reduce operational thermal gradients along the wavelength conversion device 20.

Another example of athermalization is illustrated in the embodiment of FIGS. 5 and 6, where the wavelength conversion device 20 and laser source 10 are supported by a common substrate 70 comprising a mounting groove 72. The mounting groove 72 comprises tapered wall portions 74 and a minimum lateral dimension z exceeding a corresponding lateral dimension z' of the wavelength conversion device 20 such that, when the wavelength conversion device 20 is positioned in the mounting groove 72 between the tapered wall portions 74, longitudinal gaps 76 extend between the wavelength conversion device 20 and the mounting groove 72. Longitudinally-oriented structures 78 are positioned between the tapered wall portions 74 of the mounting groove 72 and the sides of the wavelength conversion device 20. For the purposes of describing and defining the present disclosure, it is noted that longitudinal refers to the direction from the input face of the wavelength conversion device 20 to the output face 26 of the wavelength conversion device 20.

Figure 5A:
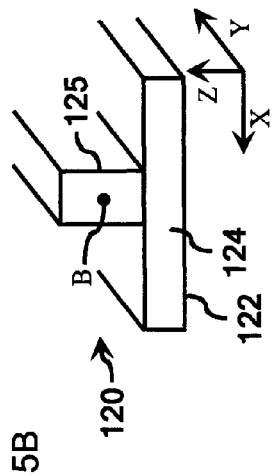
Figure 5B:
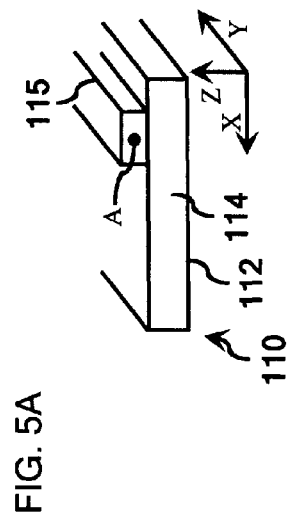

FIGS. 5-7 illustrate an optical package 100 comprising a laser source subassembly 110 and an independent wavelength conversion device subassembly 120 where proximity-coupled edge bonding is facilitated via complementary bonding interfaces. More specifically, in the embodiment of FIGS. 5-7, the laser source subassembly comprises a laser base 112 including a bonding interface 114, and a laser diode 115. The laser diode 115 is secured to the laser base 112 such that a set position A of the laser output face is fixed in an X-Y-Z coordinate system relative to the bonding interface 114 (see FIG. 5A). It is contemplated that the laser diode 115 can be secured to the laser base 112 in a variety of ways including, for example, through adhesive bonding (UV heat epoxy), soldering, laser welding, mechanical securement, etc.

Similarly, the wavelength conversion device subassembly 120 comprises a converter base 122 including a complementary bonding interface 124, and a wavelength conversion device 125 including a converter input face 126, a converter output face 128, and a waveguide extending from the converter input face 126 to the converter output face 128 at a conversion device tilt angle φ. The wavelength conversion device 125 is secured to the converter base 122 such that a set position B of the converter input face 126 and the tilt angle φ of the waveguide are fixed in an X-Y-Z coordinate system relative to the complementary bonding interface 124 (see FIG. 5B). It is contemplated that the wavelength conversion device 125 can be secured to the converter base 122 in a variety of ways including, for example, through adhesive bonding (UV heat epoxy), soldering, laser welding, mechanical securement, etc.

The laser diode 115 and the wavelength conversion device 125 are mounted to their respective bases 112, 122 in a pre-assembly process that is controlled precisely to establish the set positions A and B in predetermined locations. Given properly established set positions A and B, the bonding interface 114 of the laser base 112 can be bonded to the complementary bonding interface 124 of the converter base 122 to proximity couple the laser output face to the converter input face 126 at an orientation and interfacial spacing x that is suitable for a proximity coupled package. In general, the advantages of the designs disclosed herein where fixturing datums are employed to engage and align respective sub-assemblies to each other, measurement of the interfacial spacing x during final assembly is no longer critical because the laser source and conversion device sub-assemblies are put together with required accuracy separately and characterized before final assembly.

Although in one embodiment, the converter base 122 and the laser base 112 are substrates formed from a common metal, it is contemplated that the converter base 122 and the laser base 112 can be fabricated from any materials with approximately equivalent coefficients of thermal expansion or can be designed for approximately equivalent thermal expansion properties. In this manner, when the respective subassemblies are bonded via the respective bonding interfaces 114, 124, any thermally induced misalignment of the converter input face 126 and the laser output face that could arise from thermal expansion in the converter base 122 and the laser base 112 can be minimized and would typically be less than 0.1-0.5 μm over the operating temperature range of the optical package 100.

In FIGS. 5-7, the respective bonding interfaces 114, 124 can be described as complementary fixturing datums because, when they are urged against each other prior to bonding, their mutual engagement establishes the interfacial spacing x at the aforementioned predetermined value. The nature of the interfaces 114, 124 is such that the interfacial spacing is fixed but movement along other directions, i.e., in a plane parallel to the interfaces 114, 124, is permitted. Having noted this, it is contemplated that the complementary fixturing datums defined by the bonding interfaces 114, 124 could be modified to limit movement in more than one direction.

For example, referring to the embodiment of FIGS. 8-10, the complementary fixturing datums defined by the complementary bonding interfaces 114, 124 can be configured for engagement via a common securement to enhance fixation of the laser source subassembly 110 and the wavelength conversion device subassembly 120 in a three dimensional orthogonal coordinate system. More specifically, in the embodiment of FIGS. 8-10, the complementary fixturing datums comprise planar bonding interfaces (bonding interfaces 114, 124) and a step-shaped peripheral abutment 130 that extends along the periphery of the laser base 112 and the converter base 122. A rigid package cover 140 is provided as the common securement and a lower edge portion 142 of the rigid package cover 140 engages the peripheral abutment 130 to secure the respective subassemblies 110, 120 to each other and limit movement of the laser diode 115 relative to the wavelength conversion device 125 in more than one direction. It is contemplated that a variety of alternative devices could alternatively be employed as the common securement.

FIGS. 5-7 also illustrate the use of a laser base 112 that comprises a laser mounting slot 116 and a laser mounting insert 119. The laser mounting insert 119 is secured in the laser mounting slot 116 and the laser diode 115 is secured to the laser mounting insert 119. The insert 119 is configured to improve heat management and athermalization in the optical package 100. The thermal expansion characteristics are chosen to minimize the tensile forces in the laser diode chips over the temperature range of interest. The insert can also be used for good thermal conductivity to distribute and dissipate the heat generated by the laser diode. This aspect also provides the flexibility in choosing the laser base material somewhat independently from the insert material. An example is a laser base made of steel whereas the insert is made of copper. The steel material is lower cost and can be more easily bonded to the converter assembly by laser welding. The copper insert has good thermal conductivity and provides better thermal management of the laser diode. The copper insert in a steel base can be cold rolled together in long lengths and cut to required lengths and shapes to make low cost laser diode bases.

Figure 11:
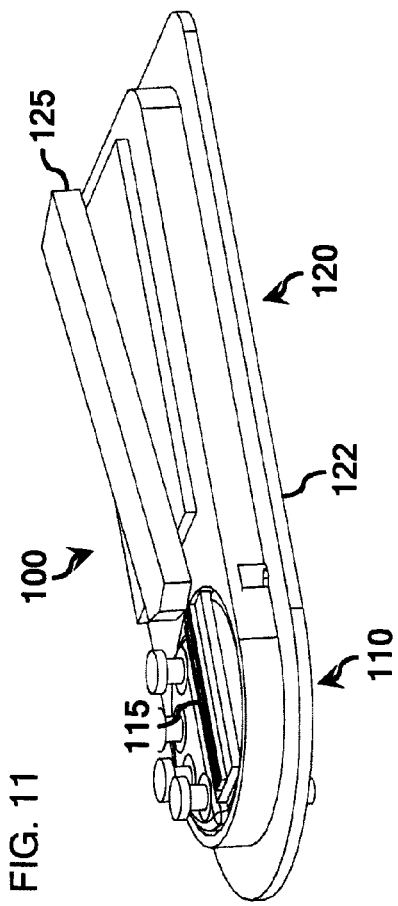

The embodiment of FIGS. 11-13, described in detail below, also utilizes a laser mounting slot and laser mounting insert to athermalize the optical package 100. In the embodiment of FIGS. 11-1 3, the laser diode 115 is mounted on an insert that matches the coefficient of thermal expansion of the laser diode and the laser diode and insert together are mounted on a TO-can style header. The header can be low cost, cold-rolled steel provided with a cut-out for the insert. Finally, it is noted that FIGS. 6-7 illustrate the use of a rigid package cover 140 and a package base 150 for encapsulation.

Figure 12:
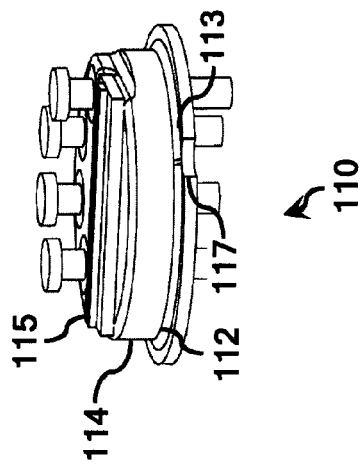
FIGS. 11-13 illustrate an optical package comprising a laser source subassembly and an independent wavelength conversion device subassembly where respective fixturing datums facilitate nesting of the laser base and the converter base.
Figure 13:
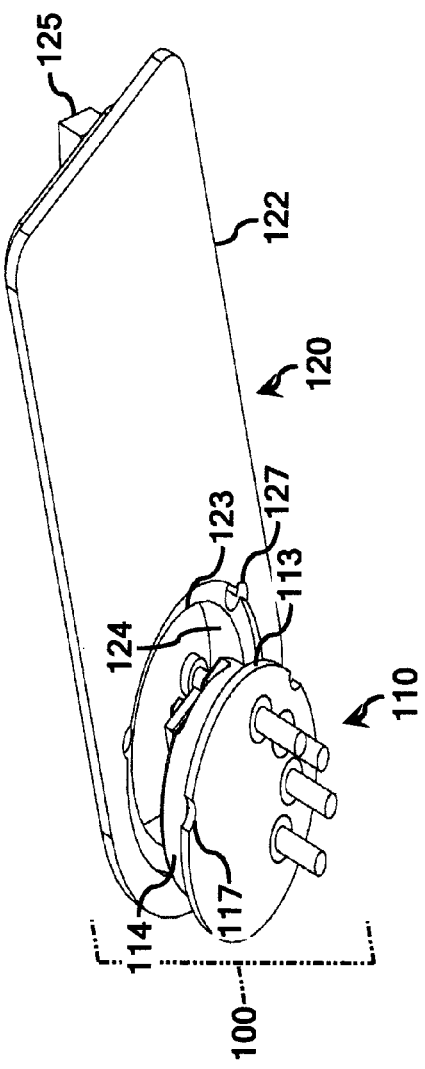

In the embodiment of FIGS. 11-13, the laser source subassembly 110 and the wavelength conversion device subassembly 120 comprise complementary fixturing datums that are configured for mutual engagement in a nested configuration. More specifically, the fixturing datum of the converter base 122 comprises an inside diameter abutment 123, and the fixturing datum of the laser base 112 comprises an outside diameter abutment 113, both of which are configured to facilitate nesting of the laser base 112 within the converter base 122 via engagement of the respective abutments 113, 123. It is contemplated that the inside and outside diameters can be circular or non-circular.

Because the fixturing datums in the embodiment of FIGS. 11-13 permit engaged rotation of the nested laser base 112 relative to the converter base 122, it may be preferable to provide the laser base 112 and the converter base 122 with rotational fixturing datums that can be used as an indication of proper rotational alignment of the laser base 112 relative to the converter base 122. In FIGS. 11-13 rotational fixturing datums are provided as semi-circular cut-outs 117 in the laser base 112 and corresponding holes 127 formed in the converter base 122. Proper rotational alignment is achieved when the semi-circular cut-outs 117 in the laser base 112 are aligned with the corresponding holes 127 formed in the converter base 122. It is contemplated that a variety of combinations of holes, slots, indicators, etc., can be provided in the laser base 112 and converter base 122 to function as rotational fixturing datums.

Although the embodiments of FIGS. 5-12 are presented in the context of a wavelength conversion device 125 that is merely tilted in the horizontal plane, it is contemplated that vertical tilting or a combination of vertical and horizontal tilting may alternatively be employed in the illustrated embodiments. Similarly, the laser source subassembly 110 and the converter subassembly 120 may be presented in a variety of configurations and may include suitable mounting hardware, mounting slots, etc. Finally, it is noted that the input face of the wavelength conversion device 125 may include the α-cut, β-cut, and ω-cut facets described above with reference to FIGS. 1-4.

Figure 14:
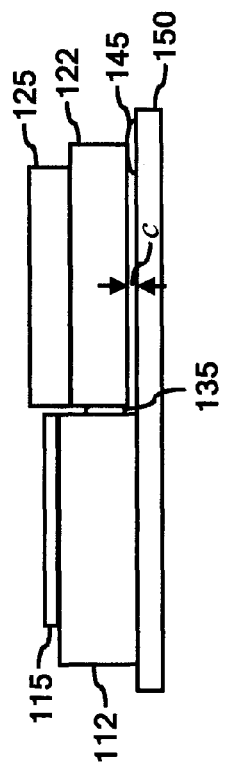
FIG. 14 is a schematic illustration of a manner for securing an optical package comprising a laser source subassembly and an independent wavelength conversion device subassembly.

Referring to the schematic illustration of FIG. 14, it is noted that the laser base 112 can be bonded to the converter base 122 via an interfacial bond 135 that separates the laser output face and the converter input face by a spacing on the order of a few microns, i.e., less than 10 microns and more than a fraction of a micron. The laser base 112 is also bonded rigidly to the package base 150 for mechanical strength and also thermal management of the heat generated by the laser diode. On the other hand, the converter base 122 is rigidly bonded to the laser base only, but not to the package base 150. The converter base 122 can be secured to the package base 150 via a less rigid topographic securement 145 that forms a thermal excursion gap c between the conversion device subassembly and the package base 150. The topographic securement 145 may comprise an elastomeric adhesive or some other type of elastomeric component that is designed to yield to micron-level thermal excursions in the optical package 100. In this manner, the converter subassembly can be isolated from the package base 150 to avoid misalignment due to CTE mismatches in the optical package 100.

More specifically, in the embodiment of FIG. 14, only the laser base 112 is rigidly and intimately attached to the package base 150. This provides for low thermal impedance and a good heat dissipation path for the laser diode. The converter base 122 is secured to the package base 150 via, e.g., an elastomeric adhesive or other type of flexible bond, to form a thermal excursion gap c between the conversion device subassembly and the package base 150. For example, and not by way of limitation, the thermal excursion gap c can mitigate the effects of thermal excursions within the optical package 100 if it is less than approximately 100 μm, although larger gaps would also be effective. The criteria in choosing the gap is to relax the manufacturing and alignment tolerances of the substrates, while at the same time making sure that the converter base and the package base are not in intimate contact. With this gap, any thermal expansion mismatches between the package base and converter base are not transferred to the converter base and cause misalignment. Typically, it will be preferable to secure the converter base 122 to the laser base 112 via more rigid glue, a laser weld, or some other type of relatively rigid bond to prevent any residual expansion mismatches in the package and subassembly bases from distorting the package and causing misalignment.

Although this aspect of the present disclosure is merely illustrated with reference to FIG. 14, this manner of isolation via a relatively flexible topographic securement 145 can be incorporated into the other embodiments disclosed herein. In any case where thermal expansion in the optical package would cause the laser and converter bases to expand away from the relatively rigid bond at the bonding interface, since the separation of the respective facets of the laser diode and wavelength conversion device are only a couple of microns, and the relatively flexible topographic securement permits non-disruptive thermal excursions, the resulting movement of these points relative to each other, would merely be on the order of a fraction of a micron along the longitudinal axis of the optical package. In contrast, if the respective facets were to be separated by a few millimeters, the thermal expansion would leads to movement proportional to that separation, i.e., on the order of a few microns, and can lead to the destructive contact of the respective facets of the laser diode and wavelength conversion device.

It is noted that recitations herein of a component of the present disclosure being "configured" in a particular way, to embody a particular property, or function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component. It is also noted that some non-critical structural details of the laser source subassembly, e.g., lead lines, electrical connections, etc., have been omitted from the illustrations presented herewith to preserve clarity but will be readily apparent to those familiar with laser diode design and assembly.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present disclosure it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the subject matter of the present disclosure in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

The invention claimed is:

1. An optical package comprising a laser source subassembly and a wavelength conversion device subassembly, wherein:
    the laser source subassembly comprises
        a laser base comprising a bonding interface and
        a laser diode comprising a laser output face;
    the laser diode is secured to the laser base such that a set position A of the laser output face is fixed relative to the bonding interface;
    the wavelength conversion device subassembly comprises
        a converter base comprising a complementary bonding interface and
        a wavelength conversion device comprising a converter input face, a converter output face, and a waveguide extending from the converter input face to the converter output face at a conversion device tilt angle;
    the wavelength conversion device is secured to the converter base such that a set position B of the converter input face and the tilt angle of the waveguide are fixed relative to the complementary bonding interface;
    the bonding interface of the laser base is bonded the complementary bonding interface of the converter base such that the laser output face is proximity-coupled to the converter input face at an interfacial spacing x that is determined from the fixed position A of the laser output face and the fixed position B of the converter input face.

2. An optical package as claimed in claim 1 wherein the converter base and the laser base are designed such that, when bonded via the respective bonding interfaces:
    the fixed position A of the laser output face and the fixed position B of the converter input face are separated by a spacing on the order of a few microns; and
    thermally induced misalignment of the converter input face and the laser output face as a result of thermal expansion in the converter base and the laser base is a fraction of a micron over the operating temperature of the optical package.

3. An optical package as claimed in claim 1 wherein:
    the converter base and the laser base further comprise complementary fixturing datums; and
    the complementary fixturing datums are configured for mutual engagement or for engagement via a common securement to enhance fixation of the laser source subassembly and the wavelength conversion device subassembly relative to each other in a three dimensional orthogonal coordinate system.

4. An optical package as claimed in claim 1 wherein:
    the bonding interface of the laser base is bonded the complementary bonding interface of the converter base via an interfacial bond that separates the fixed position A of the laser output face and the fixed position B of the converter input face by a spacing on the order of a few microns; and
    the converter base is secured to the package base via a topographic securement that forms a thermal excursion gap c between the wavelength conversion device subassembly and the package base.

5. An optical package as claimed in claim 1 wherein the interfacial bond and the topographic securement comprise an elastomeric component designed to yield to micron-level thermal excursions in the optical package.

6. An optical package as claimed in claim 1 wherein the bonding interface of the laser base and the complementary bonding interface of the converter base comprise planar bonding interfaces.

7. An optical package as claimed in claim 1 wherein the converter base and the laser base further comprise complementary fixturing datums that are configured to cooperate with a common securement suitable for engaging the complementary fixturing datums of the converter base and laser base.

8. An optical package as claimed in claim 6 wherein the complementary fixturing datums cooperate to form a peripheral abutment extending along peripheral portions of the laser base and the converter base and the common securement is configured to engage the peripheral abutment.

9. An optical package as claimed in claim 1 wherein the converter base and the laser base further comprise complementary fixturing datums that are configured for mutual engagement, the fixturing datum of the converter base comprises an inside diameter abutment, and the fixturing datum of the laser base comprises an outside diameter abutment, both of which are configured to facilitate nesting of the laser base within the converter base via engagement of the respective abutments.

10. An optical package as claimed in claim 9 wherein:
the respective fixturing datums are configured to permit engaged rotation of the nested laser base relative to the converter base.

11. An optical package as claimed in claim 10 wherein the laser base and the converter base further comprise rotational fixturing datums configured to indicate rotational alignment of the laser base relative to the converter base.

12. An optical package as claimed in claim 1 wherein the converter base and the laser base are formed as metallic substrates.

13. An optical package as claimed in claim 1 wherein the respective coefficients of thermal expansion of the converter base and the laser base are matched so that the relative movement between the laser diode waveguide and converter waveguide in the vertical direction is limited to approximately 0.5 μm or less over the operating temperature range of the optical package.

14. An optical package as claimed in claim 1 wherein the conversion device tilt angle comprises a vertical component, a horizontal component, or a combination of vertical and horizontal components.

15. An optical package as claimed in claim 1 wherein the converter base comprises a mounting slot oriented at the tilt angle of the waveguide and the wavelength conversion device is secured in the angled mounting slot.

16. An optical package as claimed in claim 1 wherein the laser diode is secured to laser base via an epoxy, solder, or a laser weld.

17. An optical package as claimed in claim 1 wherein:
the laser base further comprises a laser mounting slot and a laser mounting insert configured to facilitate heat dissipation and minimize thermal mismatch over the operating temperature range of the optical package with submicron precision.

18. An optical package as claimed in claim 1 wherein:
the input face of the wavelength conversion device comprises an α-cut facet and β-cut facet;
the α-cut facet of the input face is oriented at a horizontal angle α, relative to the waveguide of the wavelength conversion device to permit proximity coupling of the output face of the laser source and the input face of the wavelength conversion device;
the β-cut facet of the input face is oriented at a horizontal angle β, relative to the waveguide of the wavelength conversion device and cooperates with the horizontal tilt angle φ to reduce back reflections from the input face of the wavelength conversion device into the laser source; and $$-\alpha+\beta 180° \text{ and } \alpha<\phi.$$

19. An optical package as claimed in claim 1 wherein the input face of the wavelength conversion device further comprises an ω-cut facet oriented at a vertical angle ω, relative to the waveguide of the wavelength conversion device to permit optimal proximity coupling of the inclined output face of the laser source and the input face of the wavelength conversion device.

20. An optical package as claimed in claim 1 wherein:
the laser diode defines an optical axis and the output face of the laser diode is oriented at a vertical angle δ relative to the optical axis;
the input face of the wavelength conversion device is oriented at a vertical angle θ relative to the waveguide of the wavelength conversion device;
the waveguide of the wavelength conversion device is oriented at a vertical tilt angle γ relative to the optical axis of the laser source; and
the vertical angle θ and the vertical tilt angle γ are selected to at least partially compensate for optical misalignment introduced by the laser output face angle δ.

21. An optical package as claimed in claim 20 the input face of the wavelength conversion device further comprises an ω-cut facet oriented at a vertical angle ω, relative to the waveguide of the wavelength conversion device to permit proximity coupling of the output face of the laser diode and the input face of the wavelength conversion device.

22. An optical package comprising a laser source subassembly and a wavelength conversion device subassembly, wherein:
the laser source subassembly comprises a laser base comprising a bonding interface and a laser diode comprising a laser output face;
the laser diode is secured to the laser base such that a set position A of the laser output face is fixed relative to the bonding interface;
the wavelength conversion device subassembly comprises a converter base comprising a complementary bonding interface and a wavelength conversion device comprising a converter input face, a converter output face, and a waveguide extending from the converter input face to the converter output face at a conversion device tilt angle;
the wavelength conversion device is secured to the converter base such that a set position B of the converter input face and the tilt angle of the waveguide are fixed relative to the complementary bonding interface;
the input face of the wavelength conversion device comprises an α-cut facet and β-cut facet;
the α-cut facet of the input face is oriented at a horizontal angle α, relative to the waveguide of the wavelength conversion device to permit proximity coupling of the output face of the laser source and the input face of the wavelength conversion device;
the β-cut facet of the input face is oriented at a horizontal angle β, relative to the waveguide of the wavelength conversion device and cooperates with the horizontal tilt angle φ to reduce back reflections from the input face of the wavelength conversion device into the laser source such that $$-\alpha+\beta 180° \text{ and } \alpha<\phi;$$

the bonding interface of the laser base is bonded the complementary bonding interface of the converter base such that the laser output face is proximity-coupled to the converter input face at an interfacial spacing x that is determined from the fixed position A of the laser output face and the fixed position B of the converter input face; and
the converter base and the laser base further comprise complementary fixturing datums configured for mutual engagement or for engagement via a common securement to enhance fixation of the laser source subassembly and the wavelength conversion device subassembly relative to each other in a three dimensional orthogonal coordinate system.

* * * * *